United States Patent [19]

Beech

[11] Patent Number: 5,535,246
[45] Date of Patent: Jul. 9, 1996

[54] METHOD OF VIDEO NOISE REDUCTION USING NON-LINEAR PRE/DE-EMPHASIS

[75] Inventor: Brian H. Beech, Bishopstoke, United Kingdom

[73] Assignee: National Transcommunications Limited, Winchester, United Kingdom

[21] Appl. No.: 972,458

[22] PCT Filed: Jun. 4, 1992

[86] PCT No.: PCT/GB92/01003

§ 371 Date: Feb. 3, 1993

§ 102(e) Date: Feb. 3, 1993

[87] PCT Pub. No.: WO92/22136

PCT Pub. Date: Dec. 10, 1992

[30] Foreign Application Priority Data

Jun. 4, 1991 [GB] United Kingdom .................. 9111926

[51] Int. Cl.$^6$ .................................................. H04N 5/21
[52] U.S. Cl. ........................ 375/285; 375/296; 348/613
[58] Field of Search ........................... 375/60, 296, 297; 333/10, 14; 358/166, 167; 455/63; 332/123, 160, 162; 348/613, 608; 381/106

[56] References Cited

U.S. PATENT DOCUMENTS

| | | | |
|---|---|---|---|
| 3,972,010 | 7/1976 | Dolby | 333/14 |
| 4,109,212 | 8/1978 | Donnell | 333/14 |
| 4,281,295 | 7/1981 | Nishimura et al. | 333/14 |
| 4,462,001 | 7/1984 | Girard | 375/57 |
| 4,803,732 | 2/1989 | Dillon | 381/106 |
| 4,890,300 | 12/1989 | Andrews | 375/60 |
| 5,079,633 | 1/1992 | Hagino et al. | 358/166 |
| 5,105,446 | 4/1992 | Ravoalavoson et al. | 375/60 |
| 5,107,520 | 4/1992 | Karam et al. | 375/60 |
| 5,191,597 | 2/0293 | Ekelund et al. | 375/60 |

OTHER PUBLICATIONS

WO88/0780, PCT, Oct. 6, 1988.
European Conference on Speech Communication and Technology; Eurospeech 89; Sep. 1989; vol. 1 Tubach et al.: pp. 582–585.
Moorer et al; Linear–Phase Bandsplitting: Theory and Applications; AES Convention; 1984; pp. 1–15.
Etude et concpetion d'un DE–ESSER; Electronique Radio Plans; Mar. 1990; No. 508; pp.25–32.

*Primary Examiner*—Stephen Chin
*Assistant Examiner*—Timothy J. May
*Attorney, Agent, or Firm*—Watson Cole Stevens Davis

[57] ABSTRACT

A method of pre-emphasising a signal comprises the steps of a) receiving the signal as an input; b) applying the input signal to a processing system comprising a pair of parallel signal processing paths each comprising a non-linear phase filter and a non-linearity, and a further parallel path, wherein the filters in the pair of processing paths have equal but opposite phase responses and substantially equal magnitude responses, and wherein the outputs of the parallel processing paths are combined to produce the raw pre-emphasised signal; whereby the input signal is subjected to a non-linear dynamic range compression which is phase linear. Alternatively or additionally the input signal is split into at least three different frequency bands for non-linear processing. Preferably the pre-emphasised signal is pre-corrected using an iterative system. Complementary de-emphasis systems are also described, as well as pre-emphasis and de-emphasis apparatus.

12 Claims, 11 Drawing Sheets

PRE-EMPHASIS BUILDING BLOCK

USING LOW-PASS FILTER

USING HIGH-PASS FILTER

LP AND HP FILTERS ARE COMPLEMENTARY SO HAVE MATCHING DELAYS. N IS IDEAL SO NO DELAY.

$N'(V) = N(V) - V$

AT ADDER: A (INPUT) + (1-A)(o/p OF LAST STAGE) - A (o/p OF BD)

DE-EMPHASIS BUILDING BLOCK

PRE-EMPHASIS BUILDING BLOCK

METHOD OF VIDEO NOISE REDUCTION USING NON-LINEAR PRE/DE-EMPHASIS

BACKGROUND OF THE APPLICATION

1. Field of the Invention

The present invention relates to the field of signal processing and, in particular to the processing of video signals so as to achieve an improved noise reduction.

2. Related Art

Non-linear pre and de-emphasis has been used for noise reduction of video signals. Non-linear pre/de-emphasis of a type referred to as E7 has been used successfully for satellite transmission of the MAC packet family and is now specified in the EBU MAC packet specification (Tech Doc 3258). Due to the trend towards lower satellite power there is a desire to achieve further noise improvement. Attempts to achieve this by using more severe non-linear functions have shown two problems:

Firstly, it has been found that using a more severe non-linear function the peak to peak deviation of the FM signal increases and this can result in truncation noise caused by the restricted channel bandwidth.

Secondly, it has been found that although better noise performance can be achieved in plain areas of TV pictures, the noise in highly detailed areas is not improved and is sometimes worsened. E7 relies on the subjective masking effect of the picture on the noise. This principle breaks down if the non-linear parameters are modified in an attempt to achieve a significantly greater noise improvement.

FIG. 1 shows de-emphasis configurations which have been used for E7. The signal is split into two frequency bands using either a low pass filter (FIG. 1a) or a high pass filter (FIG. 1b) and a subtraction. The high frequency components are subjected to non-linear processing and then recombined within the unmodified low frequency components,. The non-linear law used in the de-emphasis is generally as shown in FIG. 2.

Further alternative structures which could be used to implement this type of non-linear pre-emphasis are shown in FIGS. 1 (c) and 1 (d). FIG. 1(c) shows a simple case where low pass and high pass filters are used to separate the low and high frequency bands so that the non-linearity may be applied to the high frequency band alone. FIG. 1 (d) shows a more sophisticated arrangement in which, instead of generating the low pass path using the high pass filter and subtractor of FIG. 1 (b), it has been generated by modifying the non-linearity to a form $N' = N(V) - V$, which produces a result which is mathematically equivalent. This structure is preferred because it uses fewer elements than the other arrangements. Also, when the non-linearity is implemented using a look-up table implemented as a PROM, fewer bits are needed to represent the output of the PROM when the modified non-linearity N' is used. Thus the capacity of the PROM may be reduced.

Non-linear pre-emphasis for PAL signals has also been proposed in our co-pending British patent application no. 9027598.3. FIG. 3 shows the pre-emphasis structure including pre-correction which has been used. The non-linearities N1, N2 are related to a non-linearity N of the same form as that in FIG. 2, by the following relations:

$$N_1 (V_1) = N (V_1) - V_1 \tag{1}$$

$$N_2 (V_1) = N^{-1} (V_1) - V_1 \tag{2}$$

Where the output $V_o$ of a non-linearity is related to its input $V_1$ by the relation $V_o = N(V_1)$, and $N^{-1}$ is the reciprocal function of N. N is a monotonic function.

SUMMARY OF THE INVENTION

In a first aspect, the present invention provides a method of pre-emphasising a signal comprising the steps of:

a) receiving the signal as an input;

b) applying the input signal to a processing system comprising a pair of parallel signal processing paths each comprising a non-linear phase filter and a non-linearity, and a further parallel path, the filters in the pair of processing paths having equal but opposite phase responses and substantially equal magnitude responses; and c) combining the outputs of the parallel paths to produce a raw pre-emphasised signal, whereby the input signal is subjected to a non-linear dynamic range compression which is phase linear.

The first aspect of the present invention further provides pre-emphasis apparatus comprising:

means for receiving an input signal;

a system for processing the input signal, the processing system comprising a pair of parallel processing paths each comprising a non-linear phase filter and a non-linearity, and a further parallel path, wherein the filters in the pair of processing paths have equal but opposite phase responses and substantially equal magnitude responses; and means for combining the outputs of the parallel processing paths to produce a raw pre-emphasised signal, whereby the signal processing and combination produces a non-linear dynamic range compression of the input signal which is phase linear.

The first aspect of the present invention still further provides a method of de-emphasising a signal comprising the steps of:

a) receiving the signal as an input;

b) applying the input signal to a processing system comprising a pair of parallel signal processing paths each comprising a non-linear phase filter and a non-linearity, and a further parallel path, the filters in the pair of processing paths having equal but opposite phase responses and substantially equal magnitude responses; and c) combining the outputs of the parallel paths to produce the de-emphasised signal, whereby the input signal is subjected to a non-linear dynamic range expansion which is phase linear.

The first aspect of the present invention yet further provides de-emphasis apparatus comprising;

means for receiving an input signal;

a system for processing the input signal, the processing system comprising a pair of parallel signal processing paths each comprising a non-linear phase filter and a non-linearity, and a further parallel path, wherein the filters in the pair of processing paths have equal but opposite phase responses and substantially equal magnitude responses; and means for combining the outputs of the parallel paths to produce a de-emphasised signal, whereby the signal processing and combining produces a non-linear dynamic range expansion of the input signal which is phase linear.

In a second aspect the present invention provides a method for pre-emphasising a signal comprising the steps of:
a) receiving the signal as an input;
b) splitting the input signal into more than two frequency bands;
c) subjecting at least two of the frequency bands to respective non-linear transfer functions which are independent of one another; and
d) recombining the different frequency bands of the signal to produce a raw pre-emphasised signal.

The second aspect of the invention further provides a method of de-emphasising a signal comprising the steps of:
a) receiving the signal as an input;
b) splitting the input signal into more than two frequency bands;
c) subjecting at least two of the frequency bands to respective non-linear transfer functions which are independent of one another; and
d) recombining the different frequency bands of the signal to produce the de-emphasised signal.

The second aspect of the invention yet further provides apparatus for pre-emphasising a signal, comprising:
means for receiving the signal as an input;
means for processing the input signal, the processing system comprising at least two parallel signal processing paths each comprising a filter and a non-linearity, and another parallel path, wherein the filters are adapted to pass signals in different frequency bands; and
means for combining the outputs of the parallel paths;
wherein the filters and non-linearities in the parallel paths are adapted such that the input signal is split into more than two frequency bands and at least two of the frequency bands are subjected to respective independent non-linear functions.

The second aspect of the invention still further provides apparatus for de-emphasising a signal, comprising:
means for receiving the signal as an input;
means for processing the input signal, the processing system comprising at least two parallel signal processing paths each comprising a filter and a non-linearity, and another parallel path, wherein the filters are adapted to pass signals in different frequency bands; and
means for combining the outputs of the parallel paths;
wherein the filters and non-linearities in the parallel paths are adapted such that the input signal is split into more than two frequency bands and at least two of the frequency bands are subjected to respective independent non-linear functions.

One advantage provided both by embodiments of the first and embodiments of the second aspect of the present invention is that they produce greater noise improvement than the prior art systems without a visible increase in noise in detailed areas. A further advantage provided by embodiments of the first aspect of the invention is that they reduce the peak to peak FM deviation of the signal. This reduction in deviation will then allow transmission in narrower band FM channels without incurring truncation noise, or alternatively it will allow an increase in permissible deviation for a given F.M. channel.

Preferred embodiments of the invention incorporate the first and the second aspects of the invention and provide both of the above advantages.

BRIEF DESCRIPTION OF THE DRAWINGS

Further features and advantages of the present invention will become clear from the following description of embodiments thereof, given by way of example, in which:

FIG. 4 shows block diagrams of pre-emphasis configurations according to preferred embodiments of the invention, in which:

DETAILED DESCRIPTION

Figure 5:
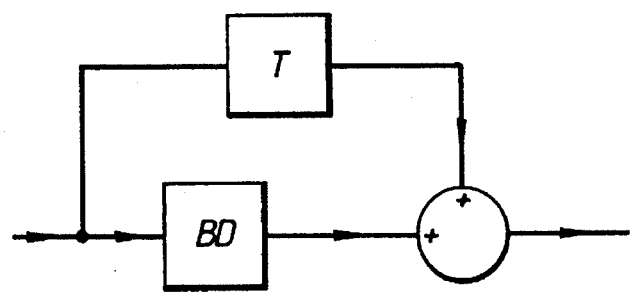
FIG. 5 shows a block diagram of a de-emphasis configuration according to a preferred embodiment of the present invention.

Turning now to consider FIGS. 4 and 5. BP is a pre-emphasis building block. BD is a de-emphasis building block.

The building blocks BP, BD and their use within the structures of FIGS. 4 and 5 in order to provide a complementary compression/expansion process demonstrate the advantageous features of the first and second aspects of the present invention.

The noise reduction process according to the present invention may be implemented so as to substantially reduce visible noise modulation effects in the resultant TV picture.

Figure 4A:
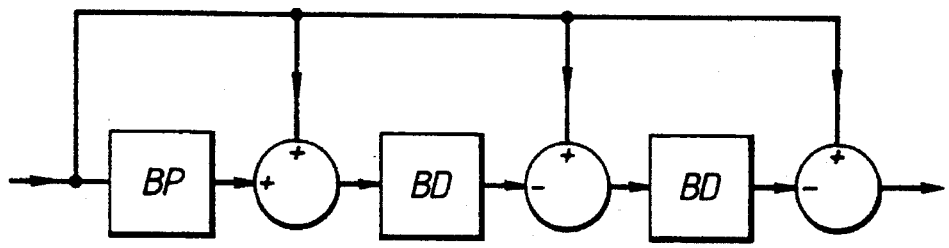
FIG. 4a shows a block diagram of a pre-emphasis configuration applying pre-correction.

The pre-emphasis configuration of FIG. 4a is a pre-corrector structure of which two levels of pre-correction are shown but this principle can be extended to any number of stages in order to reduce the overall error to as small a value as required. (This is only true when BD is suitably designed so that the error is convergent). In practice the number of pre-correction stages used will represent a compromise balancing the following factors: the desire to obtain the most accurate possible pre-emphasis (many pre-correction stages) and the need to keep equipment costs low (few ore-correction stages). It is to be understood that padding delays (not shown) will be provided in the input signal path to take into account delays in the filters and, if necessary, in the non-linearities.

For most signal frequencies, the signal output from the successive stages of the FIG. 4a pre-emphasis configuration will be a closer and closer approximation to the desired signal (assuming that the non-linearities have been selected to produce a convergent error). However, the correction implemented by each stage of the pre-corrector is only an approximation to the true error at each stage. For certain frequencies the initial raw pre-emphasised signal approximates very closely to the ideal signal and application of subsequent pre-correction stages can lead to a gradual increase in error.

One way of coping with the above problem is to set the number of pre-correction stages sufficiently low so that for frequencies where the error is increasing with each stage the cumulative error will still be low at the output of the pre-emphasis circuit.

Figure 4B:
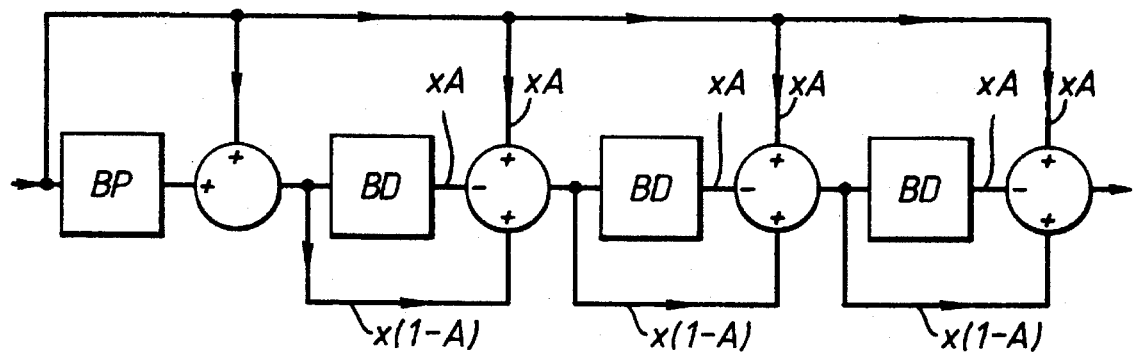
FIG. 4b shows a block diagram of a modification of the FIG. 4a configuration.

A better way of solving the problem is to scale or weight the correction applied at each stage, as shown in the embodiment of FIG. 4b.

FIG. 4b shows a modified pre-corrector configuration having three stages of pre-correction. As with FIG. 4a the necessary padding delays are not shown. At each pre-correction stage the pre-emphasised signal is corrected by an amount dependent on a weighting factor A which takes values between 0 and 1. The pre-emphasis configuration of FIG. 4a may be considered to be a special case of the configuration of FIG. 4b (i.e. where A=1).

Certain values of A are easier than others to implement using digital hardware (e.g. values n/m; where m is small and a power of 2, e.g. ⅞). It is preferable to select the scaling factor A from one of these simpler values. For a given number of pre-correction stages and given filter and non-linearity functions it is a simple matter to determine, by experiment or computer simulation, which value of A gives optimum error performance.

One simple technique for determining useful values of A to apply to a given pre-correction pre-emphasis configuration is to produce a computer simulation of the circuit, to select a test value for A, to apply a pseudorandom sequence as the input signal, to take the simulated output of the pre-emphasis circuit and apply it to a simulation of the corresponding de-emphasis circuit and compare the result with the initial input signal. The best value of A to use is that which produces the best match between these signals. In one embodiment of the FIG. 4b circuit (using three pre-correction stages) a value of A=0.875 has been found to provide a good compromise between having a fast rate of error convergence and being simple to implement in hardware.

Figure 4C:
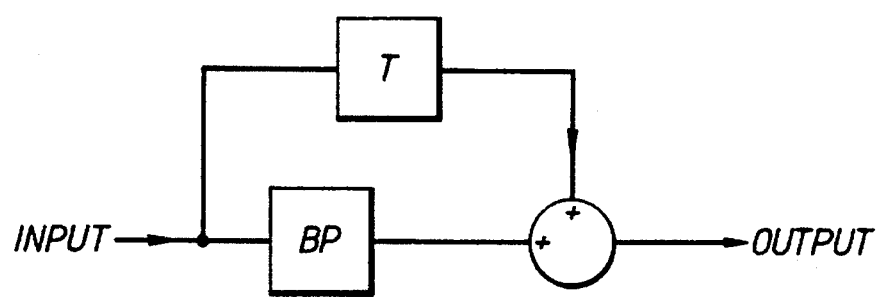
FIG. 4c shows a block diagram of a basic pre-emphasis configuration.

Of course, there are advantages to using the first and second aspects of the present invention even in simple pre-emphasis structures (i.e. which do not use pre-correction). Structures analogous to the structures of FIGS. 1 (a) to 1 (d) could also be used. An example of a suitable simple structure is shown in FIG. 4c.

It would also be possible to cater for inaccuracies in the pre-emphasis/de-emphasis process by suitable processing in the de-emphasis system. However, for applications where there is likely to be one pre-emphasis circuit and a large number of de-emphasis circuits (e.g. signal broadcasts) it is prefereable to keep the level of complexity of the de-emphasis circuitry low.

Figure 6:
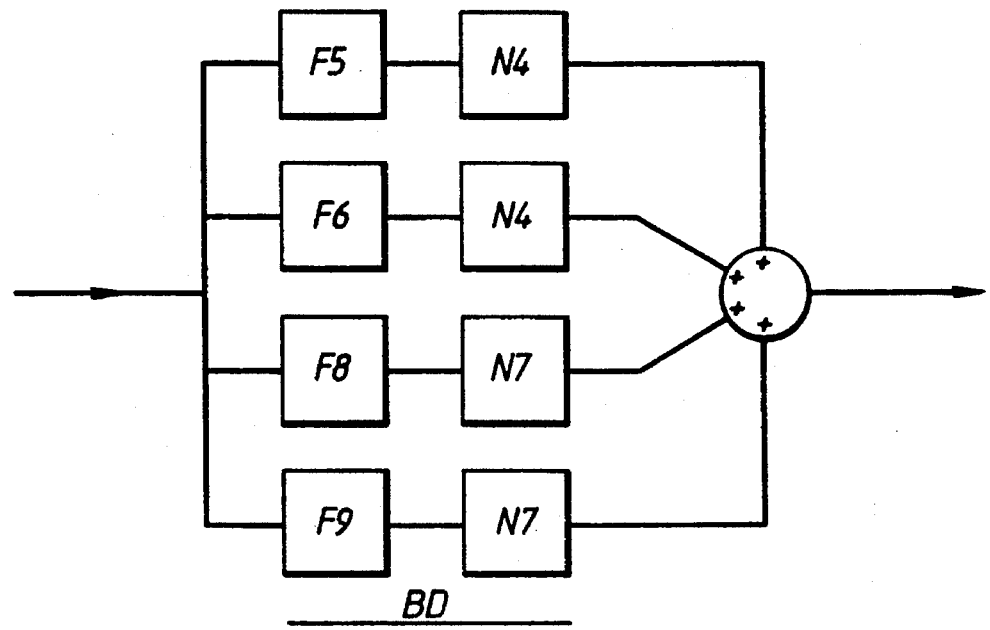
FIGS. 6 and 7 show an example of de-emphasis and pre-emphasis building blocks, optimised for the transmission of extended definition or high definition video signals, that may be used in the configurations of FIGS. 4 and 5.
Figure 7:
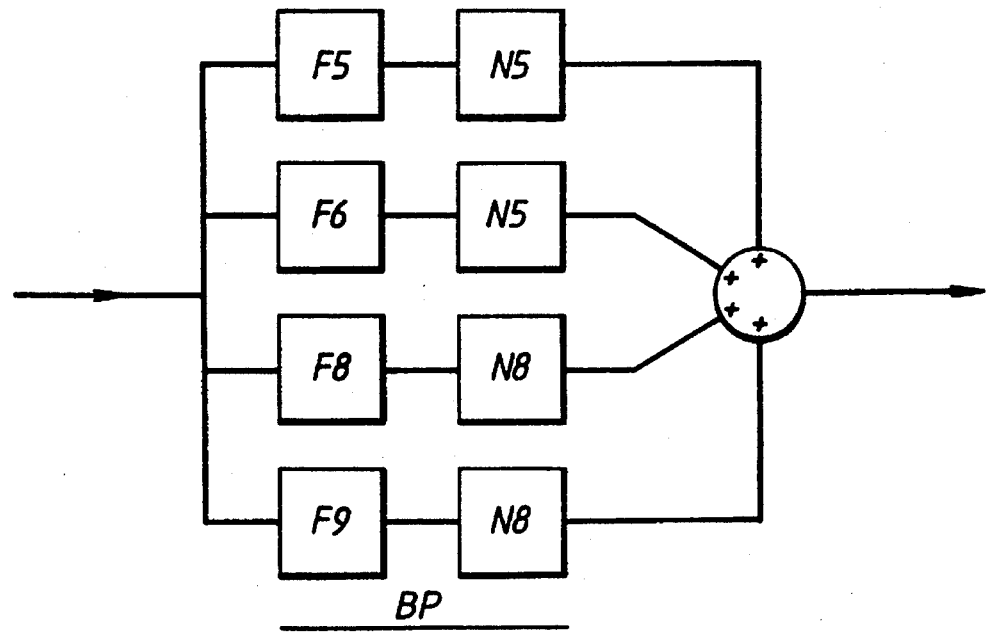

FIGS. 6 and 7 show an example of BD and BP which have been designed for the transmission of extended definition and high definition television through low power narrow band satellites. These examples incorporate both the first and the second aspect of the present invention. $F_5$, $F_6$, $F_8$, $F_9$ are filters. $N_4$, $N_5$, $N_7$, $N_8$ are non-linearities. The nature of the non-linearities $N_4$, $N_5$, $N_7$ and $N_8$ is further discussed below.

Figure 8:
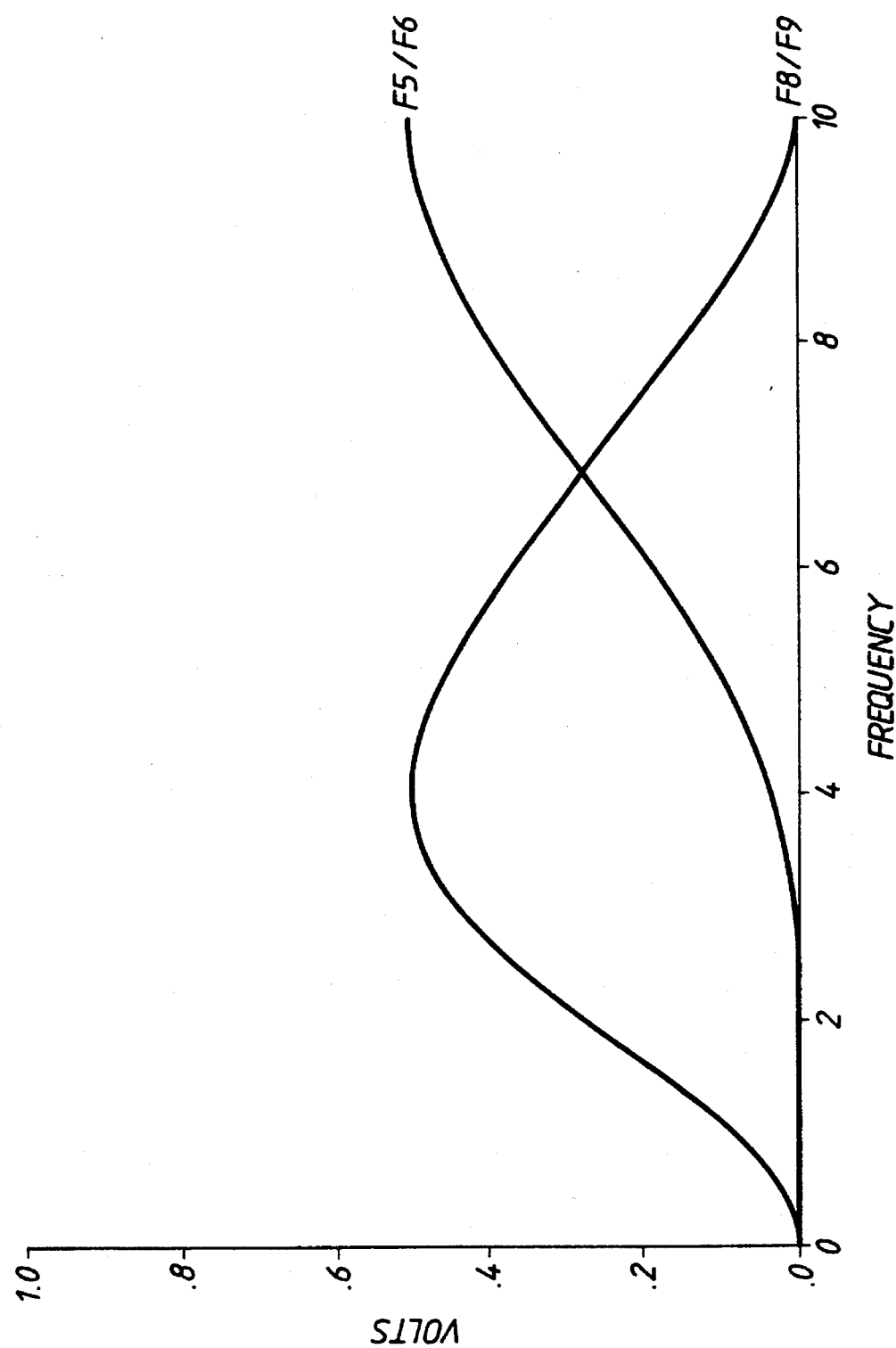
FIG. 8 shows typical characteristics of the filters shown in FIGS. 6 and 7.

FIG. 8 shows typical filter characteristics. Filters $F_5$, $F_6$ are non-linear phase filters which have identical magnitude responses, but equal and opposite phase responses. Filters $F_8$, $F_9$ are also non-linear phase filters with identical magnitude responses but equal and opposite phase responses. The sum of the responses of $F_5$, $F_6$, $F_8$, $F_9$, forms a high pass filter. One way of looking at this is to consider that the system works by splitting the signal in phase and also in the frequency domain. A four way split is shown in FIGS. 6 and 7, that is a two-way split in phase and a two-way split in frequency. Evidently the system could be extended for example to a 2(phase)×3(frequency) split.

Similarly, a worthwhile, but lesser, improvement in noise performance may be obtained in a basic system configured so that one or more of the frequency bands does not incorporate a phase split. For example, when applying such a basic system to video signals it would be preferable to have a phase split in the low frequency band and leave high frequency bands intact in view of the fact that the majority of the energy is concentrated at low frequencies in video signals. The "unsplit" path would include a filter and non-linearity of appropriate form.

In embodiments incorporating only the first aspect of the invention the signal is only split in phase. In embodiments incorporating only the second aspect of the invention the signal is only split in frequency. The advantages of the two aspects of the invention are illustrated below under the headings "Phase Split" and "Frequency Split". The discussion still considers the examples of FIGS. 6 and 7, which incorporate both aspects of the invention.

Phase Split

Figure 9:
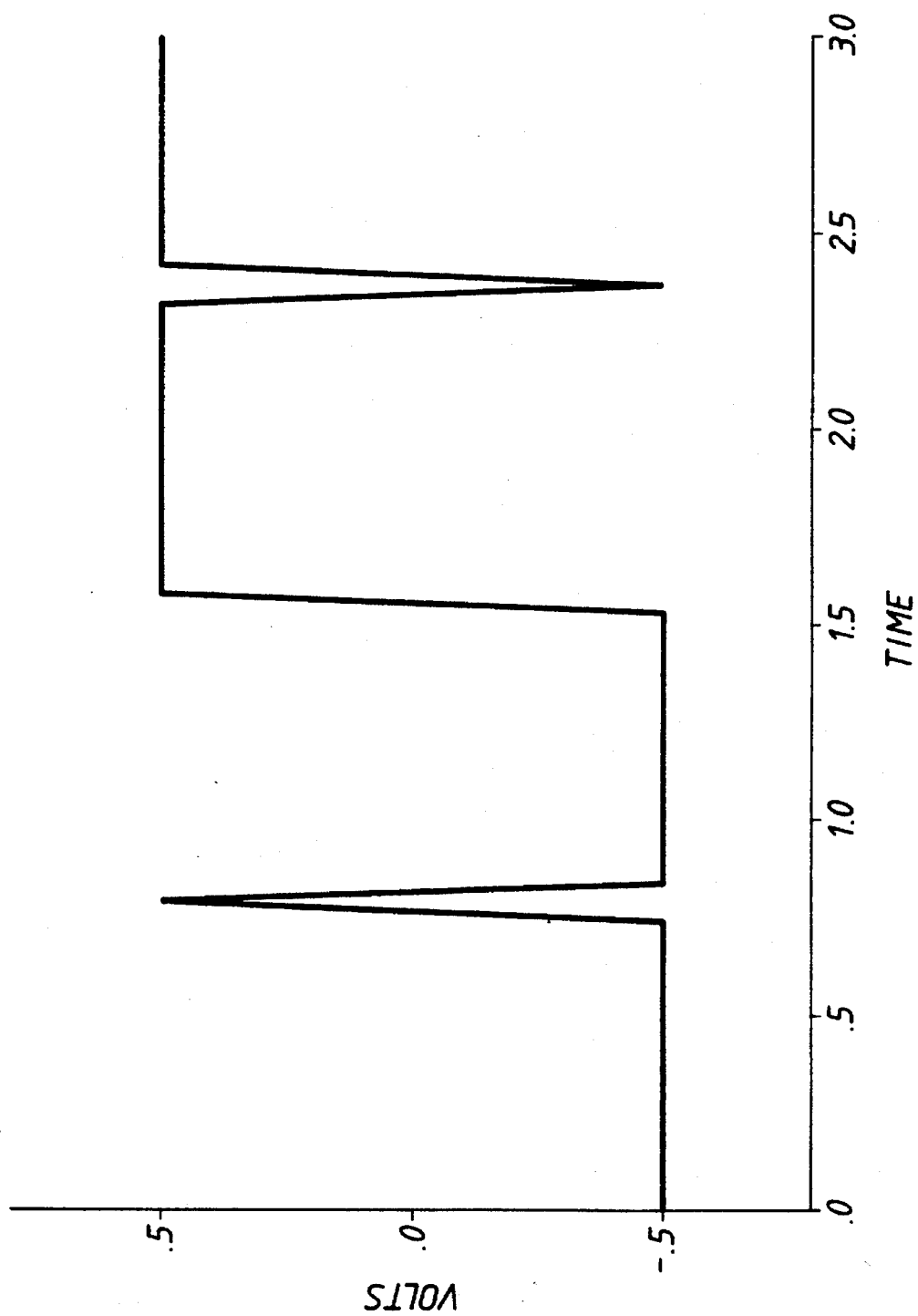
FIG. 9 shows a test signal including an impulse and a step.
Figure 10:
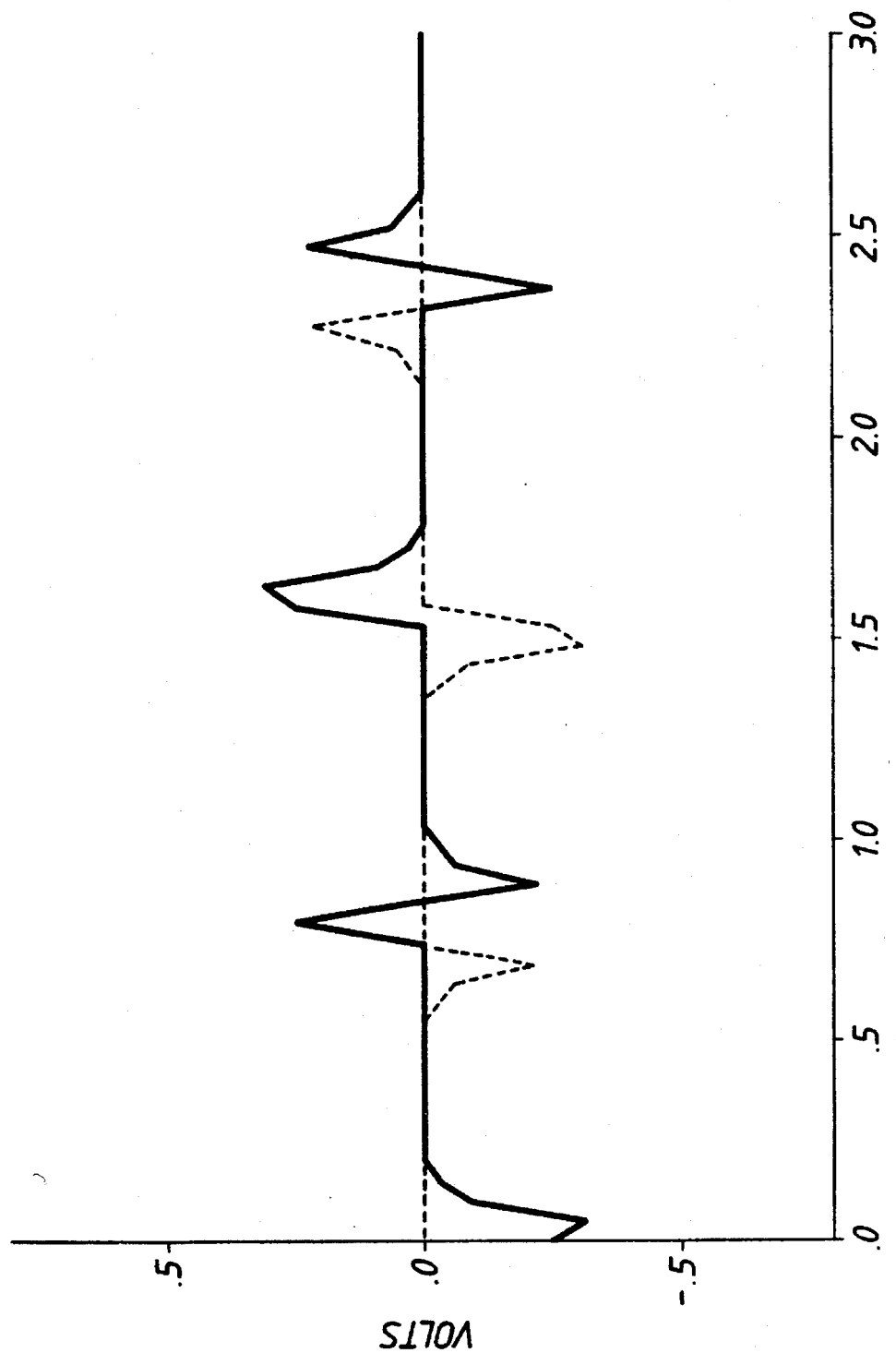
FIG. 10 shows the response of the individual filters $F_8/F_9$ to an applied signal having the form of the FIG. 9 test signal.
Figure 11:
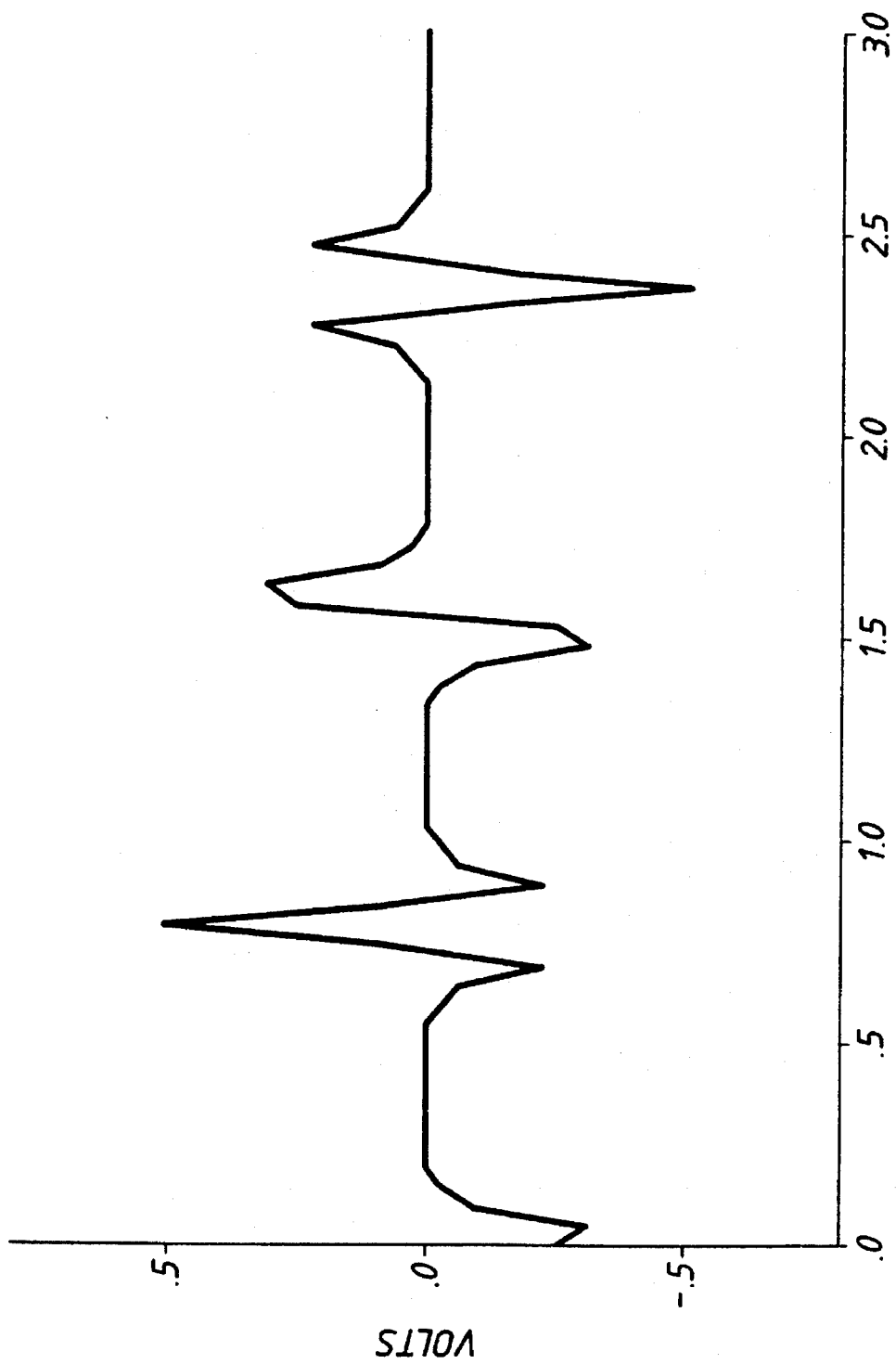
FIG. 11 shows the summed response of the filters F8/F9 to the FIG. 9 test signal.

For a given video signal, the responses at the outputs of $F_5/F_6$ will occur at different points in time. The same is true for $F_8/F_9$. Consider the impulse/step test signal of FIG. 9. The responses of the "half" filters $F_8/F_9$ would typically be as shown in FIG. 10. It should be noted that the filters eg $F_8/F_9$ are non-linear phase, but the summation of the two responses is linear phase (FIG. 11). The advantages of applying the non-linear function at the output of the half filters instead of at the output of a single, linear phase, full filter can be understood by comparing FIG. 10 with FIG. 11.

a) For satellite transmission, non-linear phase (analogue) linear pre and de-emphasis is generally employed. The result of this is that truncation effects in the satellite channel occur primarily on step transitions, and to a lesser extent on pulse waveforms. The use of linear phase filtering (FIG. 11) results in a much lesser response to step transitions than to impulses, so it is impossible to find a non-linear function which will compress the step transition without unecessarily compressing to a very high degree the impulse.

Now referring to FIG.10. The step response of the half filters is greater than their impulse response. This means that the step response can be compressed more than the impulse response and this gives the optimal situation for eliminating truncation noise in the satellite transmission where a non-linear phase linear pre-emphasis is used eg PAL, MAC, HDMAC. This process is also effective in reducing truncation noise in situations where the demodulator in the receiver has a phase lock loop device which has .itself got a non-linear phase loop response.

Simulations using a test signal consisting of a pseudo random sequence have confirmed that the system will reduce truncation noise for modulating signals of a random nature.

b) Previous approaches to compressing the signal have been tried using non-linear phase filtering. However this can result in a visible increase in noise in detailed areas, particularly on step transitions. It is a specific feature of the first aspect of the invention that non-linear phase processing paths are employed with equal and opposite phase responses, so that the overall response is linear phase and noise modulation effects are distributed in a symmetrical way about step transitions (and other waveforms), so that the visibility of noise modulation is minimised.

Frequency Split

Referring to FIG. 1 in the prior art, $F_2$ is a high pass filter, and therefore for satellite transmission where the noise spectrum is triangular, most of the noise appearing at the de-emphasis output will arise from the output of the non-linearity N. When the wanted vision signal does not contain a large HF component, the noise is attenuated by N (see FIG. 2), since the slope of the curve for small signals is small.

However, for large magnitude high frequency signals, the noise is magnified by N because the wanted signal biases the noise to a point on the non-linear curve where the slope is greater than unity.

An additional problem is that intermodulation occurs between the wanted signal and the noise, due to the non-linearity. For example, if the wanted signal is a sine wave of frequency $F_w$, then due to the symmetrical non-linearity N, noise around frequency $2F_w$, will be down converted to near dc, where the noise will be subjectively more visible. It is worth noting that these two problems arise, because unlike other noise reduction systems (for example audio noise reduction), E7 is an instantaneous companding system.

Figure 1A:
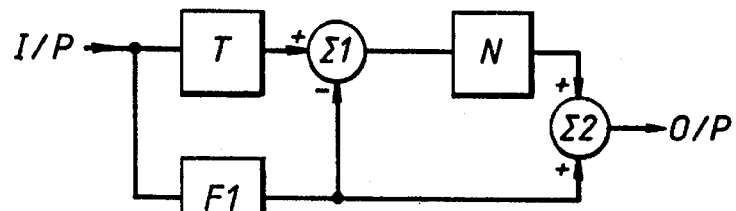
FIGS. 1 (a)–1 (d) shows in block diagrammatic form prior art de-emphasis configurations which have been used to implement the E7 de-emphasis.
Figure 1B:
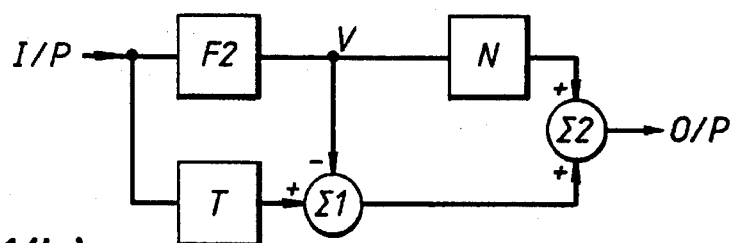
Figure 1C:
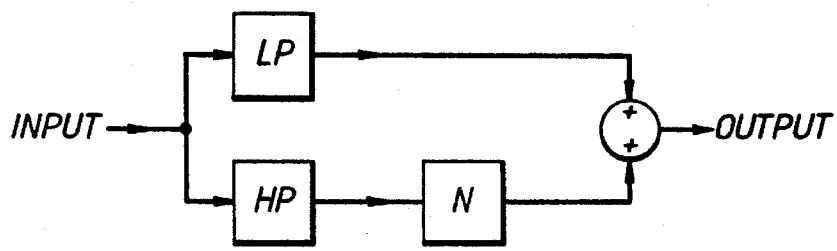
Figure 1D:
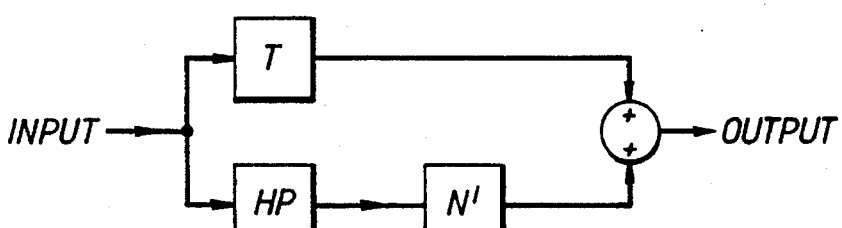
Figure 2:
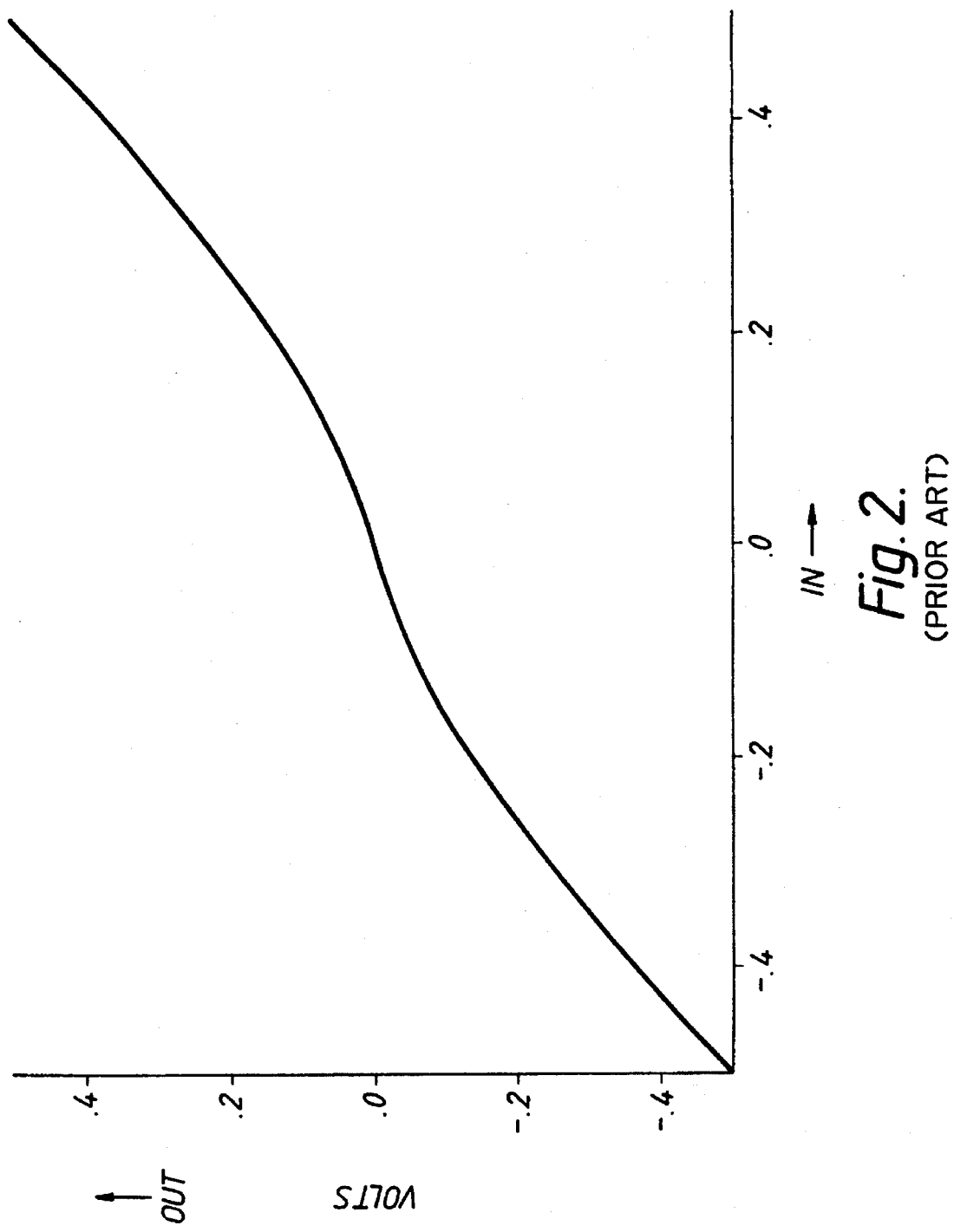
FIG. 2 is a graph showing the form of the non-linearity used in the E7 de-emphasis.
Figure 3:
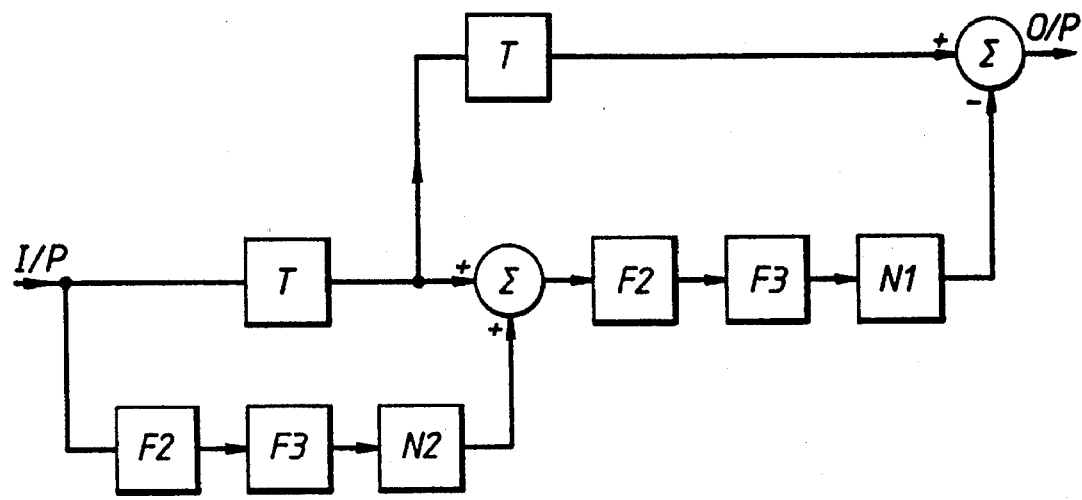
FIG. 3 shows a block diagram of a prior art pre-emphasis system for application to a video signal of the PAL format.

Now consider the de-emphasis network (FIGS. 5, 6) according to the invention. The noise contribution at the output arises from 4 (in the example) separate paths. Referring to the filter characteristics of FIG. 8 it is clear that the noise power at the input to the non-linearities will be less than in the case of the prior art (FIG. 2), because the noise bandwidth of each filter is less than that of high pass filter $F_2$ (FIG. 2).

Consider for example, a wanted signal consisting of a large 4 MHz sine wave. The noise modulation effect caused by this will be less than in the prior art case because only the noise at the outputs of filters $F_8/F_9$ will be modulated. In the case of a 10 MHz wanted signal, only the noise at the output of filters $F_5/F_6$ will be modulated.

In other words, the signal is split up into a number of different frequency bands for processing, each band being subjected to a respective independent non-linearity. The noise affecting the signal is likewise split between the different frequency bands. When a large amplitude tone causes a noise signal to be biassed to a part of the de-emphasis characteristic where the noise is magnified this effect will only affect one of the frequency bands. Thus, the adverse effect will only boost a smaller fraction of the noise signal.

Additionally, the use of the filtering shown in FIG. 8, will reduce the LF (down converted) component of noise due to intermodulation with the signal. In the case of $F_5/F_6$, the dominant LF products due to the multiplication of $2×F_w$ and the noise cannot occur since only wanted signals below 5 MHz will produce these and these are highly attenuated by the filter.

In the case of $F_8/F_9$, wanted signals of frequency around 5 MHz can no longer produce LF intermodulation components because there can only be generated from noise components around $2F_w$ (10 MHz) and these noise components are highly attenuated by the filter. In the general case, there will still remain some LF "intermodulation" noise but this is reduced by the method of the present invention.

It is an advantage of the present invention that it provides means for implementing processing which splits the signal in the frequency domain so that the signal to noise ratio in the presence of the wanted signal is improved, relative to the prior art, and so that the generation of LF noise due to intermodulation between the wanted signal and the channel noise, is reduced.

In embodiments of the invention applied to the transmission of high definition signals it may be desired to ensure that the pre-emphasised signal is compatible with existing receivers (designed to receive conventional video signals). In such cases it is preferable that the low frequency component of the input signal should not be subjected to a non-linear function. Instead, respective independent non-linearities are applied to higher frequency bands of the signal.

Nonlinearities

Figure 12:
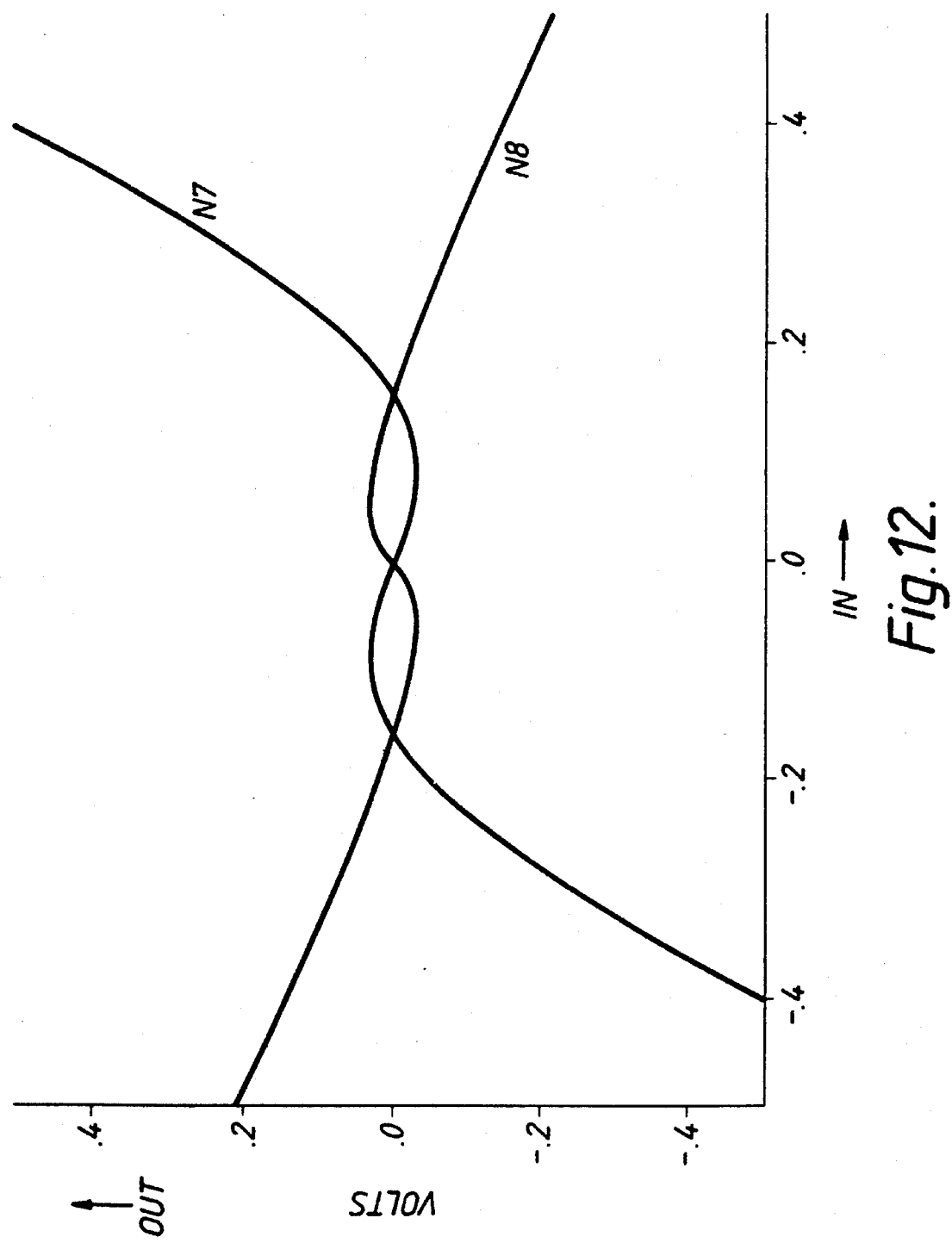
FIG. 12 shows an example of the non-linearities $N_7/N_8$ optimised for the processing of an HDMAC signal.
Figure 13:
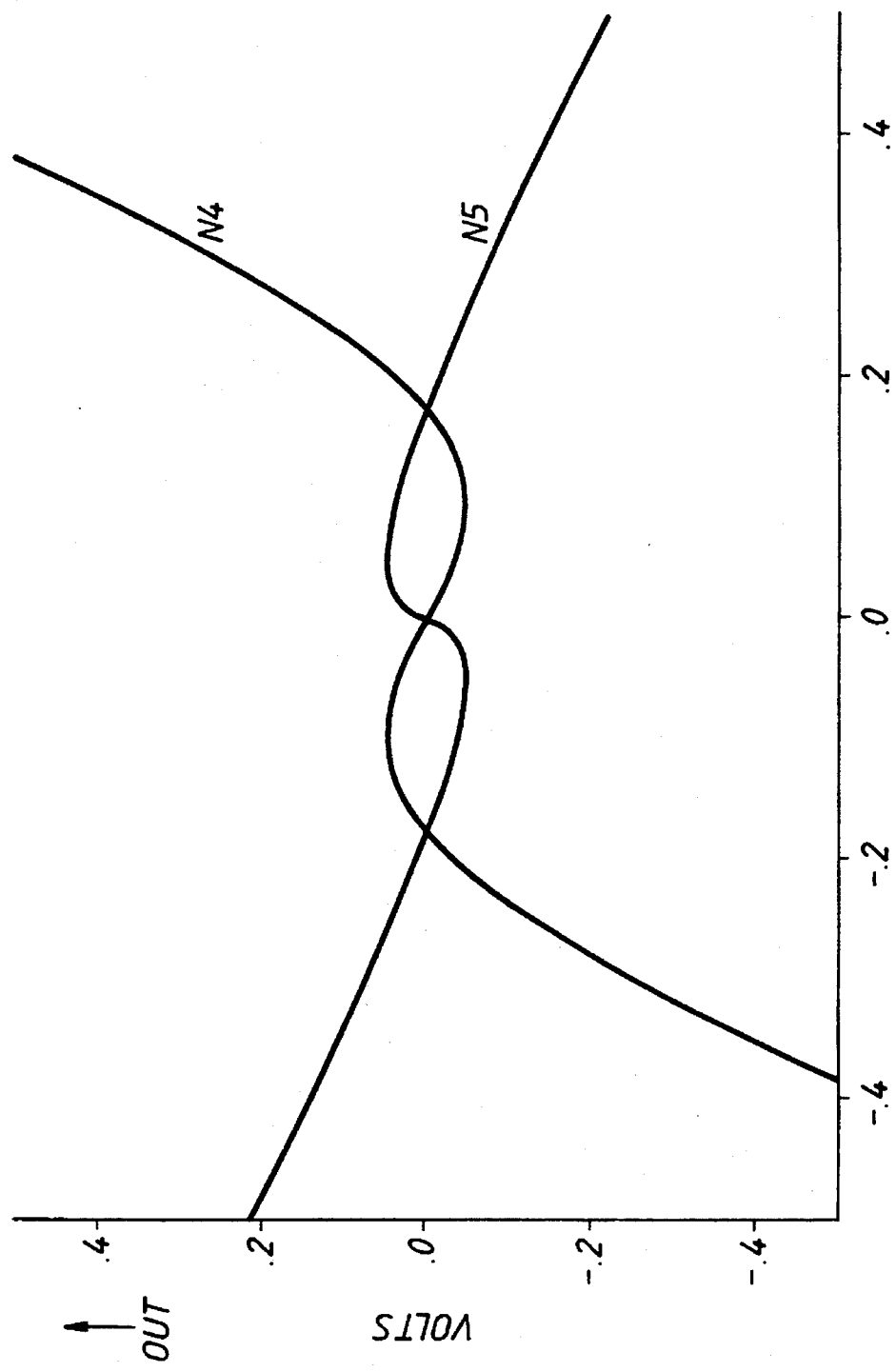
FIG. 13 shows an example of the non-linearities $N_4/N_5$ optimised for the processing of an HDMAC signal.

The non linear functions $N_4$, $N_5$, $N_6$, $N_8$ are non-monotonic functions. For the example illustrated in this document (which is optimised for the transmission of HDMAC) the functions are illustrated in FIGS. 12, 13. These are derived from base monotonic functions of the same general form as the function N shown in FIG. 2. The transformation from monotonic to non-monotonic functions is achieved by relationships such as those indicated in equations (1), (2) above.

However, the base monotonic function $N_L$ used to generate the non-linearities $N_4$ and $N_5$ used in the lower frequency band differs from the base monotonic function $N_U$ used to generate the non-linearities $N_7$ and $N_8$ used in the higher frequency band. Also, although the base monotonic functions $N_L$ and $N_U$ are of the same type as the base monotonic function N of equations (1) and (2) above they are optimised to suit the particular input signal being processed (which, as noted above, is an HDMAC signal in the preferred embodiments of the invention).

For the non-linearities of FIGS. 6 and 7 the equivalent expressions to equations (1) and (2) above are:

$$N_4(V_1)=N_L(V_1)-V_1$$

$$N_5(V_1)=N_L^{-1}(V_1)-V_1$$

$$N_7(V_1)=N_U(V_1)-V_1$$

$$N_8(V_1)=N_U^{-1}(V_1)-V_1$$

The prior art describes a method for non-linear pre/de-emphasis to improve the signal to noise ratio of television pictures transmitted by satellite. The noise improvement in "plain" areas of picture can be improved by using a more severe non-linear characteristic.

It has been found that this causes an increase in noise in detailed areas of the picture and also increases truncation noise generated in the satellite channel.

It is an advantage of both aspects of the invention that they each provide a means of achieving a greater noise improvement than previously achievable without a visible increase of noise in detailed areas. A greater improvement is obtained by using both aspects of the invention together.

It is an advantage of the first aspect of the invention that it provides a means of compressing the signal, so that for any given satellite channel, a higher deviation may be used without incurring truncation noise. This provides an additional noise improvement compared with what would otherwise be possible.

I claim:

1. A method of pre-emphasizing a signal comprising the steps of:
   a) receiving the signal as an input;
   b) applying the input signal to a signal processing system comprising a plurality of parallel signal processing paths each comprising a non-linear phase filter and a non-linearity, the plurality of parallel signal processing paths including at least one pair of parallel signal processing paths in which the non-linear phase filters have substantially equal but opposite phase responses and substantially equal magnitude responses;
   (c) said applying step further comprises combining the respective outputs of the plurality of parallel signal processing paths to produce a raw pre-emphasized signal, wherein the plurality of parallel signal processing paths operate on different frequency bands; and wherein the input signal undergoes a non-linear dynamic range compression which is phase linear; and
   d) applying a pre-correction by de-emphasizing the raw pre-emphasized signal, subtracting the de-emphasized signal from the input signal to produce an error signal, and combining the error signal with the raw pre-emphasized signal to form a pre-emphasized signal with one degree of pre-correction.

2. A pre-emphasis method according to claim 1, wherein the pre-correcting step comprises the steps of:
   applying the raw pre-emphasized signal to a de-emphasis building block comprising parallel signal processing paths, each comprising a filter and a non-linearity, the non-linearities Nd in the parallel processing paths being related to the corresponding non-linearities Np applied in the processing system by the basic monotonic equations:

$N_d (V_1) = N_b (V_1) - V_1$ $N_p (V_1) = N_b (V_1) - V_1$

Where $N_b$ is a monotonic function,
   and wherein the outputs of the parallel processing paths are combined to produce the output of the de-emphasis building block; and
   subtracting the output of the de-emphasis building block from the input signal to produce a pre-emphasised signal with one degree of pre-correction.

3. A pre-emphasis method according to claim 2, further comprising n pre-correction stages and wherein the pre-correction step is iteratively performed and wherein the output of the n-1th pre-correction stage is multiplied by a scaling factor (1−A) and combined with A times the input signal and with A times the output of the de-emphasis building block in the nth pre-correction stage to produce the output of the nth pre-correction stage where A is a weighting factor 0<A<1.

4. A pre-emphasis method according to claim 1, wherein the step of applying comprises applying the input signal to a processing system in which the applied non-linearities are non-monotonic non-linearities.

5. A pre-emphasis method according to claim 1, wherein the step of applying comprises applying the input signal to a processing system in which the applied non-linearities are non-monotonic.

6. A method of pre-emphasizing a signal in a video signal transmission system and de-emphasizing the received signal, comprising the steps of:
   a) receiving the signal as an input;
   b) applying the input signal to a processing system comprising a plurality of parallel signal processing paths each comprising a non-linear phase filter and a non-linearity, the plurality of parallel signal processing paths including at least one pair of parallel signal processing paths in which the non-linear phase filters have substantially equal but opposite phase responses and substantially equal magnitude responses;
   c) said step of applying further comprising combining the outputs of the parallel signal processing paths to produce the de-emphasized signal, applying the input signal to a processing system in which the applied non-linearities are non-monotonic non-linearities, and wherein the parallel signal processing paths operate on different frequency bands; and
   wherein the input signal undergoes a non-linear dynamic range expansion which is phase linear.

7. Apparatus for pre-emphasising a signal, comprising:
   means for receiving an input signal;
   a system for processing the input signal, comprising a plurality of parallel signal processing paths each comprising a non-linear phase filter and a non-linearity and operating on a different frequency band, wherein the non-linear filters in the plurality of parallel signal processing paths have substantially equal but opposite phase responses and substantially equal magnitude responses; and means for combining the outputs of the plurality of parallel signal processing paths to produce a raw pre-emphasised signal, whereby the signal processing and combining steps produce a non-linear dynamic range compression of the input signal which is phase linear; and further comprising:
   pre-correction means comprising means for de-emphasising the raw pre-emphasised signal;
   means for subtracting the de-emphasised signal from the input signal to form an error signal; and
   means for combining the raw pre-emphasised signal with the error signal to produce a pre-emphasised signal with one degree of pre-correction.

8. Pre-emphasis apparatus according to claim 7, wherein the processing system further comprises at least one additional parallel processing path, the additional processing path including a linear phase filter and a non-linearity and operating on the pair of processing paths.

9. Pre-emphasis apparatus according to claim 8, wherein the applied non-linearities are non-monotonic.

10. Pre-emphasis apparatus according to claim 7, wherein the pre-correcting means comprises:
    a de-emphasis building block for processing the raw de-emphasised signal, the de-emphasis building block comprising parallel signal processing paths, each comprising a non-linear phase filter and a non-linearity, and means for combining the outputs of the parallel signal processing paths, wherein the non-linearities Nd in the parallel processing paths are related to the corresponding non-linearities Np applied in the processing system by the basic monotonic equations:

$N_d (V_1) = N_b (V_1) - V_1$ $N_p (V_1) = N_b (V_1) - V_1$

Where $N_b$ is a monotonic function; and
    means for subtracting the output of the de-emphasis building block from the input signal to produce a pre-emphasised signal with one degree of pre-correction.

11. Pre-emphasis apparatus according to claim 10, wherein the pre-correction means performs an itertive pre-correction and includes n pre-correction stages and comprises:

means for multiplying the output of the n-1th pre-correction stage by a scaling factor (1−A);

means for multiplying the input signal by a scaling factor A;

means for multiplying the output of the de-emphasis building block on the nth pre-correction stage by a scaling factor A; and means for combining the scaled signals to produce the output of the nth pre-correction stage, where A is a weighting factor 0<A<1.

12. Pre-emphasis apparatus according to claim 7, wherein the applied non-linearities are non-monotonic non-linearities.

* * * * *